(12) United States Patent
Monceau et al.

(10) Patent No.: US 7,148,700 B2
(45) Date of Patent: *Dec. 12, 2006

(54) NORMALIZING CIRCUIT WITH REDUCED ERROR VOLTAGE

(75) Inventors: Laurent Monceau, Eybens (FR); Catherine Dubois, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 186 days.

This patent is subject to a terminal disclaimer.

(21) Appl. No.: 10/467,378

(22) PCT Filed: Feb. 11, 2002

(86) PCT No.: PCT/FR02/00510

§ 371 (c)(1),
(2), (4) Date: Jan. 12, 2004

(87) PCT Pub. No.: WO02/065637

PCT Pub. Date: Aug. 22, 2002

(65) Prior Publication Data

US 2006/0066315 A1  Mar. 30, 2006

(30) Foreign Application Priority Data

Feb. 13, 2001  (FR) .................................. 01 01931

(51) Int. Cl.
*G01R 35/00* (2006.01)
(52) U.S. Cl. .................................................... 324/601
(58) Field of Classification Search .................. None
See application file for complete search history.

(56) References Cited

U.S. PATENT DOCUMENTS

| 4,546,327 | A | | 10/1985 | Suzuki et al. | 330/253 |
| 5,050,423 | A | * | 9/1991 | Czarnocki | 73/1.62 |
| 5,132,559 | A | | 7/1992 | Baskett | 307/355 |
| 5,153,529 | A | | 10/1992 | Koda et al. | 330/295 |
| 5,532,548 | A | * | 7/1996 | Spindt et al. | 313/422 |

FOREIGN PATENT DOCUMENTS

| EP | 0 874 453 A2 | 10/1998 |
| EP | 0 993 110 A1 | 4/2000 |

OTHER PUBLICATIONS

May, D., "Notes on an Instrumentation VCA," *Electronic Engineering* 66(12):18-19, Aug. 1994.

* cited by examiner

*Primary Examiner*—Vincent Q. Nguyen
(74) *Attorney, Agent, or Firm*—Lisa K. Jorgenson; E. Russell Tarleton; Seed IP Law Group PLLC (57) ABSTRACT

A circuit for calibrating a voltage signal that includes a first voltage-to-current converter receiving the signal to be calibrated and a reference voltage and providing a current proportional to the voltage difference between the voltage of the signal to be calibrated and the reference voltage, a first current amplifier driven by the first voltage-to-current converter, a second voltage-to-current converter receiving an adjustment voltage and the reference voltage and providing a current proportional to the voltage difference between the adjustment voltage and the reference voltage, a second current amplifier driven by the second voltage-to-current converter, and a circuit for providing a calibrated voltage signal based on the difference between the currents provided by the first and second current amplifiers.

18 Claims, 5 Drawing Sheets

NORMALIZING CIRCUIT WITH REDUCED ERROR VOLTAGE

BACKGROUND OF THE INVENTION

1. Field of the Invention

The present invention relates to a circuit for calibrating a signal, that is, for providing, based on an input signal, a signal included in a predetermined range.

2. Description of the Related Art

There are various applications for calibration circuits. For example, calibration circuits are used in optical disk read systems. In such systems, a calibration circuit is arranged between a photodetector and an analog-to-digital converter to adapt the signal from the photodetector to the analog-to-digital converter input range. The integrated circuit "L6300" of STMicroelectronics is an example of a calibration circuit used in such a system.

Figure 1:
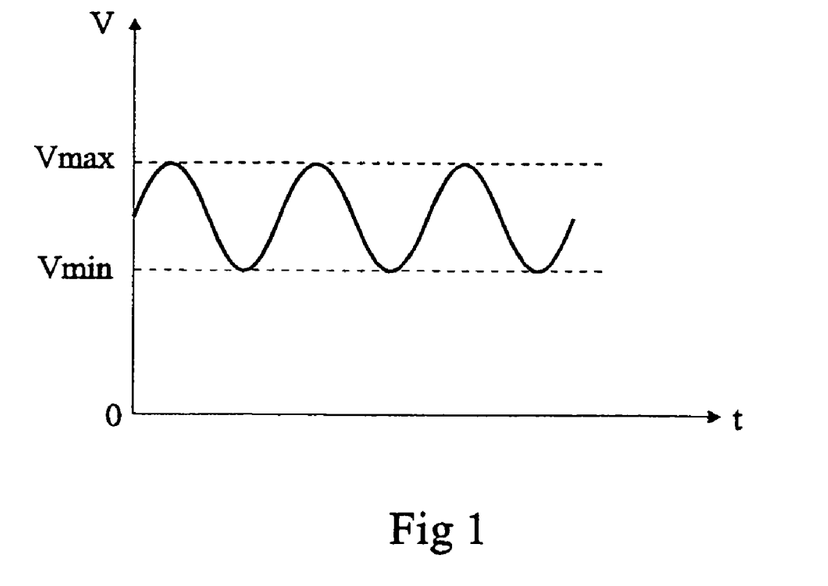
FIG. 1 illustrates the shape of an input voltage of a calibration circuit.

FIG. 1 illustrates the shape, along time, of a voltage V at the input of a calibration circuit. Voltage V, shown as a sinusoid, oscillates between a minimum value Vmin and a maximum value Vmax. In the mentioned application, voltage V coming from a photodetector oscillates above a reference level Vmin approximately equal to 2.5 volts. Peak-to-peak amplitude Vmax–Vmin of voltage V can vary within a large range from 25 to 500 millivolts, according to whether the photodetector receives all or part of the light emitted by the laser.

Figure 2:
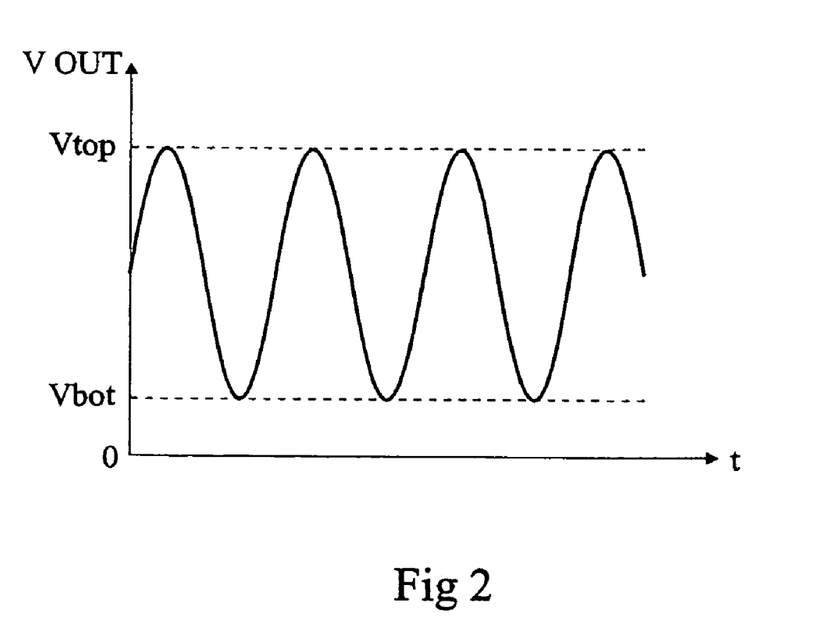
FIG. 2 illustrates the shape of the output voltage of a calibration circuit.

FIG. 2 illustrates the shape, along time, of voltage VOUT at the output of the calibration circuit. Voltage VOUT has the same frequency as voltage V, but its amplitude is constant and the signal oscillates between a minimum value Vbot and a maximum value Vtop corresponding to desired limiting values. Typical values of Vbot and Vtop, in the application mentioned hereabove, are respectively around 125 and 875 millivolts.

Generally, the forming of a calibration circuit must take into account error or offset voltages likely to affect the limiting values of output voltage VOUT. For example, in the mentioned application, an error voltage which can reach ±70 millivolts systematically affects the reference level Vmin. Further, each element of the calibration circuit introduces an error voltage specific to it. This effect is particularly substantial if the circuit includes MOS transistors, since these transistors generate greater error voltages than bipolar transistors.

Because of this, many calibration circuits, like circuit "L6300" mentioned hereabove, are formed by means of bipolar transistors. Further, since the signal processing circuits that follow the calibration circuit are generally formed by means of CMOS transistors, the calibration circuit can hardly be formed together with the circuits that follow it on a same silicon wafer to form an integrated circuit. This results in high manufacturing, testing, and interconnection costs.

Further, known calibration circuits are powered by relatively high supply voltages, greater than those supplying CMOS circuits.

BRIEF SUMMARY OF THE INVENTION

The disclosed embodiments of the present invention provide a calibration circuit in which the effect of error voltages is decreased.

The calibration circuit of the present invention can be easily be made on a same integrated circuit as a digital signal processing circuit, and it can be powered under a reduced voltage.

The present invention provides a circuit for calibrating a voltage signal that includes:

a first voltage-to-current converter receiving a voltage signal to be calibrated and a reference voltage, and providing a current proportional to the voltage difference between the voltage of the signal to be calibrated and the reference voltage, a first current amplifier driven by the first voltage-to-current converter, a second voltage-to-current converter receiving an adjustment voltage and the reference voltage and providing a current proportional to the voltage difference between the adjustment voltage and the reference voltage, a second current amplifier driven by the second voltage-to-current converter, and a means for providing a calibrated voltage signal based on the difference between the currents provided by the first and second current amplifiers.

According to an embodiment of the present invention, the means for providing the calibrated voltage signal includes:

a current conversion means driven by the second current amplifier and providing a current of same amplitude and of a direction opposite to that of the current that it receives, and a current-to-voltage converter driven by the first current amplifier and by the current conversion means and providing the calibrated voltage signal.

According to an embodiment of the present invention, the first and second current amplifiers, as well as the first and second voltage-to-current converters, have an identical structure.

According to an embodiment of the present invention, the first and second current amplifiers have a variable gain and their gain is identically controlled.

According to an embodiment of the present invention, each of the first and second current amplifiers includes several amplifier units.

According to an embodiment of the present invention, each of the first and second current amplifiers includes a first unit and a second unit, the second unit ensuring a current gain equal to 1 or to 9.

According to an embodiment of the present invention, the first unit includes:

an input node coupled to ground via a diode-connected transistor, 16 identical branches, each formed of a transistor, and 31 identical branches, each including a transistor in series with a switch, each of the transistors coupled to the input node being run through, when on, by a same current, and an output node coupled to ground via 16 identical branches, each formed of a transistor, and 31 identical branches, each including a transistor in series with a switch, each of the transistors coupled with the output node being run through, when on, by a current of same value as any one, in the on state, of the transistors coupled with the input node.

According to an embodiment of the present invention, the adjustment voltage is adjustable and is used to set the minimum value of the calibrated signal.

According to an embodiment of the present invention, the circuit includes a first current source arranged between the output of the first voltage-to-current converter and a fixed voltage, and a second current source arranged between the output of the second voltage-to-current converter and said fixed voltage.

The present invention also provides a method for calibrating a signal by means of a circuit including a first branch receiving the signal to be calibrated and a second branch receiving an adjustment voltage, the first branch including a first variable-gain current amplifier and the second branch including a second variable-gain current amplifier, the first and second current amplifiers being of identical structure and their gain being adjusted in the same way. The method includes the adjustment steps of:

a) the gain of the first and second current amplifiers being set to its maximum value, injecting into the circuit a voltage equal to the minimum value of the voltage to be calibrated and adjusting the adjustment voltage so that the minimum level of the signal at the circuit output correspond to the desired minimum level, then b) injecting the signal to be calibrated and adjusting the gain of the first and second current amplifiers so that the maximum level of the signal at the circuit output corresponds to the desired maximum level.

BRIEF DESCRIPTION OF THE SEVERAL VIEWS OF THE DRAWINGS

The foregoing features and advantages of the present invention will be discussed in detail in the following non-limiting description of specific embodiments in connection with the accompanying drawings, wherein.

DETAILED DESCRIPTION OF THE INVENTION

Figure 3:
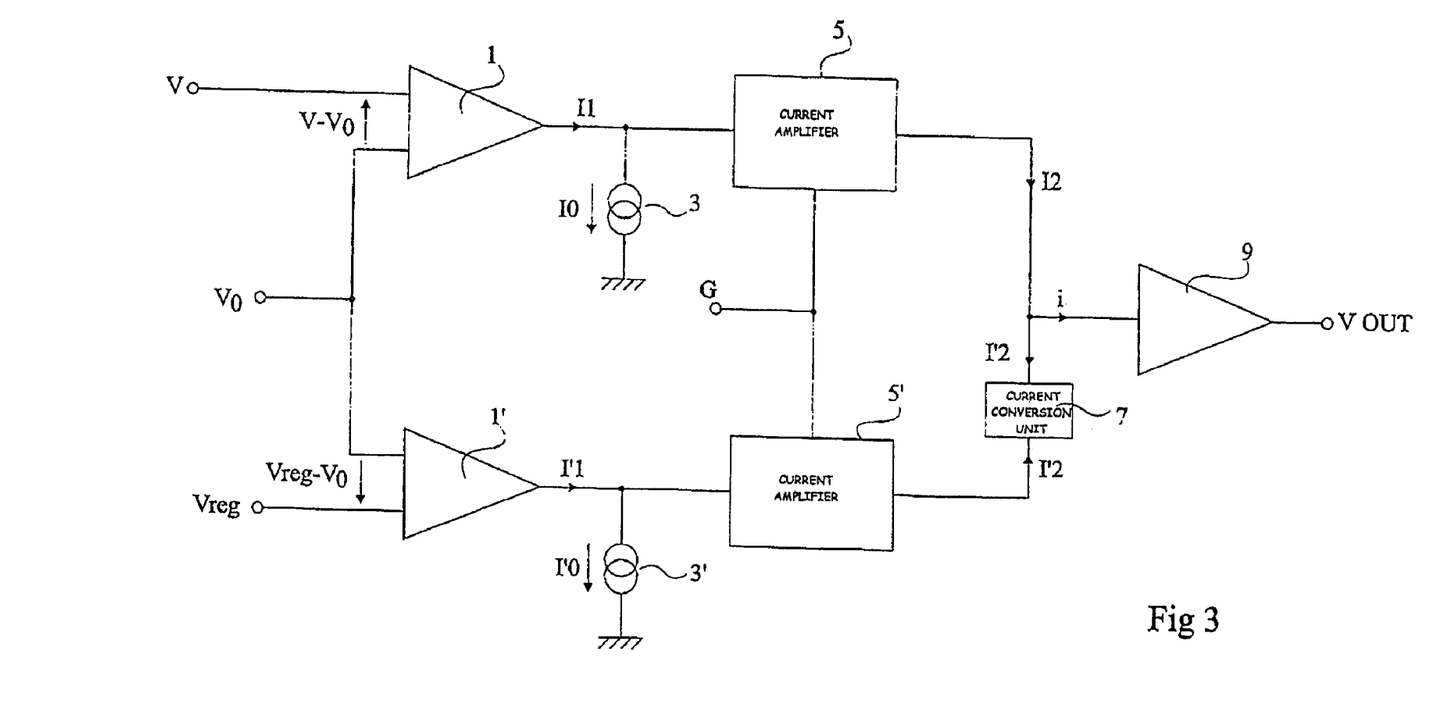
FIG. 3 shows, in the form of blocks, a calibration circuit according to the present invention.

In FIG. 3, a voltage V to be calibrated drives a voltage-to-current converter 1. Voltage-to-current converter 1 also receives a reference voltage $V_0$, and it provides a current I1 which varies proportionally to difference $V-V_0$. As will be seen hereafter, the general expression of current I1 is $I1=Im+k1.(V-V_0)$, Im and k1 being constants. A current source 3 is connected at the output of voltage-to-current converter 1 and pulls a constant current I0 to the circuit ground. The output of voltage-to-current converter 1 is connected to a current amplifier 5. Current amplifier 5 is a variable-gain amplifier and its gain G is controlled by a control terminal, also designated as G. Current amplifier 5 provides a current I2 equal to $G \times (I1-I0)$. Elements 1, 3, and 5 form a first branch of the calibration circuit.

The calibration circuit includes a second branch having the same structure as the first one. Thus, the second branch includes a voltage-to-current converter 1', a current source 3', and a current amplifier 5'. Voltage-to-current converter 1' receives an adjustment voltage Vreg and reference voltage $V_0$. Voltage-to-current converter 1' provides a current I'1 expressed as $I'1=I'm+k'1.(Vreg-V_0)$, I'm and k'1 being constants. Part of current I'1 is pulled to ground by current source 3', run through by a current I'0. Voltage-to-current converter 1' drives current amplifier 5', which provides a current I'2. Current amplifier 5' is a variable-gain current amplifier. Its gain G' is controlled by a control terminal connected, in FIG. 3, to control terminal G of amplifier 5. Current I'2 is equal to $G' \times (I'1-I'0)$.

Figure 4:
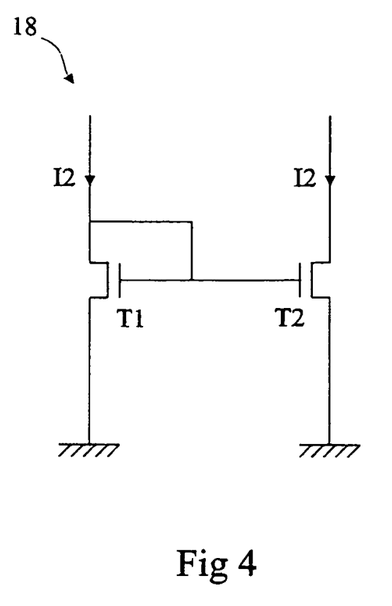
FIG. 4 shows an embodiment of an element of the circuit of FIG. 3.

The output of current amplifier 5' drives a current conversion unit 7. Current conversion unit 7 outputs a current I'2 of same amplitude as the current I'2 that it receives, but of opposite direction. Unit 7 may be formed by means of a current mirror, including for example two MOS transistors T1 and T2 connected in parallel, one of which is diode-mounted, as illustrated in FIG. 4.

The output of current amplifier 5 and the output of unit 7 are connected together to the input of a current-to-voltage converter 9. Current-to-voltage converter 9 receives a current i equal to the difference between currents I2–I'2. Current-to-voltage converter 9 provides a voltage VOUT corresponding to input voltage V, but the limiting values Vbot and Vtop of which correspond to the desired values.

Current sources 3 and 3' are optional. They are used to pull to ground part of the D.C. component of currents I1 and I'1. This enables current amplifier 5 to act on lower currents. Amplifier 5 thus is easier to form. It can be formed by means of smaller components and consumes less.

Advantageously, elements 1', 3', 5' of the second branch of the circuit have a structure identical to that of elements 1, 3, 5, respectively, of the first circuit branch. This enables easy forming of the calibration circuit and compensation for various drifts, as will be seen hereafter.

Figure 5:
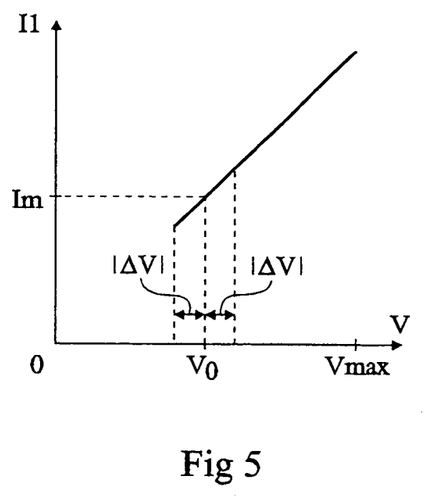
FIG. 5 shows the current-vs.-voltage graph of an element of the circuit of FIG. 3.

FIG. 5 illustrates the current-vs.-voltage characteristics of voltage-to-current converter 1. Current I1 is on the on the Y-axis and voltage V is on the X-axis. Preferably, voltage $V_0$ is selected to be as close as possible to minimum value Vmin of the voltage V to be calibrated. Lower value Vmin of voltage V thus is equal to $V_0+\Delta V$, $\Delta V$ being a positive or negative error voltage. As mentioned, current I1 is provided by expression $I1=Im+k1 (V-V_0)$. When the input voltage is equal to $V_0$, output current I1 is equal to current Im. Current Im is chosen to obtain good noise performances of the calibration circuit. In an example of practical implementation, current Im has been chosen to be equal to 500 μA.

Figure 6:
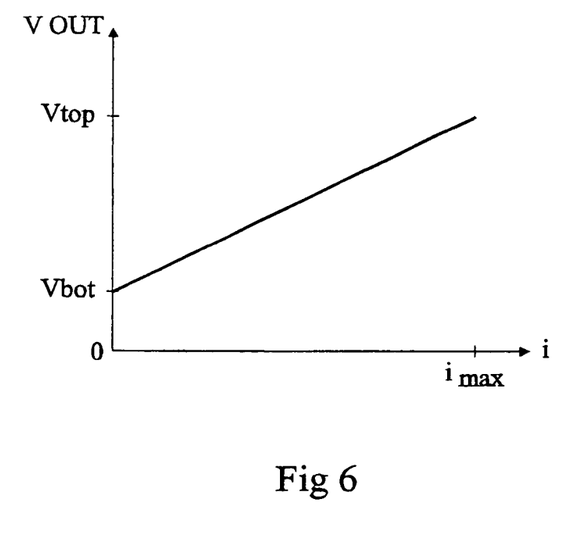
FIG. 6 shows the current-vs.-voltage graph of an element of the circuit of FIG. 3.

FIG. 6 illustrates the voltage-vs.-current characteristic of current-to-voltage converter 9. This characteristic is such that, when current i entering converter 9 is equal to 0, output voltage VOUT is equal to Vbot. When current i is maximum (imax), output voltage VOUT is equal to Vtop. $VOUT=Vbot+k2.i$, k2 being a coefficient specific to converter 9.

The operation of the calibration circuit of FIG. 3 will now be explained. Voltage V corresponds to the graph of FIG. 1, and voltage VOUT provided by the calibration circuit must range between levels Vbot and Vtop of FIG. 2. The adjustment of the limiting values of the voltage to be provided is performed in two steps.

First, the minimum level of voltage VOUT is adjusted. For this purpose, a voltage equal to Vmin is applied to the circuit input. Since voltage $V_0$ is substantially equal to voltage Vmin, voltage V corresponds to $V_0$ plus a positive or negative offset voltage, $\Delta V$, which is small as compared to $V_0$. Gain G is set to its maximum. The value of voltage VOUT at the output of the calibration circuit is then observed, and adjustment voltage Vreg is adjusted to obtain Vbot as an output. The adjustment of Vreg may be performed in any appropriate manner. For example, the adjustment of Vreg will be automatically done by means of a unit coupled to output VOUT.

Assuming that G=Gmax and that elements 1', 3', and 5' are respectively identical to elements 1, 3, and 5 (Im=I'm, I0=I'0, k1=k'1, k2=k'2):

$$I1 = Im + k1.\Delta V$$

$$I2 = Gmax.(I1-I0) = Gmax.(Im-I0+k1.\Delta V) + Ioffset,$$

Ioffset being an error current caused by the elements of the first circuit branch.

One also has:

$$I'1 = I'm + k'1.(Vreg - V_0)$$

$$I'2 = Gmax.(I'1 - I'0)$$
$$= Gmax.(I'm - I'0 + k1.[Vreg - V_0]) + I'offset,$$

I'offset being an error current due to the elements of the second circuit branch.

The expression of VOUT is:

$$VOUT = Vbot + k2.i = Vbot + k2.(I2-I2')$$

that is, with Im=I'm, I0=I'0, k1=k'1, and k2=k'2:

$$VOUT = Vbot + k1.k2.Gmax[\Delta V - (Vreg - V_0)] + k2(Ioffset - I'offset).$$

Since Vreg is adjusted so that VOUT is equal to Vbot, one has:

$$k1.k2.Gmax.(\Delta V + V_0 - Vreg) + k2(Ioffset - I'offset) = 0,$$

that is, $$Vreg = V_0 + \Delta V + \frac{(I_{offset} - I'_{offset})}{K_1 G_{max}}.$$

When the adjustment of voltage Vreg is performed, it is not modified until a new voltage V is to be calibrated. The maximum level of output voltage VOUT is then adjusted. For this purpose, voltage Vmax is applied to the input of the calibration circuit. By acting upon control terminal G, the gain of amplifiers 5 and 5' is adjusted so that the maximum value of signal VOUT is equal to Vtop. Gain G will be adjusted by any appropriate means. For example, an adequate digital unit coupled to the circuit output will drive terminal G and will automatically adjusted the gain.

After the adjustment of gain G, the adjustment of the limits of VOUT is ended and the adjustments will no longer be modified until a new voltage exhibiting values different from Vmin and/or Vmax is desired to be calibrated.

In normal operation, one has:

$$I1 = Im + k1(V - V_0)$$

$$I2 = G.(I1 - I0) = G.(Im - I0 + k1.V - k1.V_0) + Ioffset.$$

One also has:

$$I'1 = I'm + k'1(Vreg - V_0)$$

$$I'2 = G.(I'1 - I'0) = G.(I'm - I'0 + k'1.[Vreg - V_0]) + I'offset.$$

Further, VOUT=Vbot+k2.(I2-I'2).

Since Im=I'm, k1=k'1, and I0=I'0, one has:

$$VOUT = Vbot + k1.k2.G(V - Vreg) + k2(Ioffset - I'offset).$$

Since $$Vreg = V_0 + \Delta V + \frac{(I_{offset} - I'_{offset})}{K_1 G_{max}},$$

one has:

$$VOUT = Vbot + k1.k2.G(V - V_0 - \Delta V - [Ioffset - I'offset]/k1.Gmax) + k2(Ioffset - I'offset).$$

(V-V₀-ΔV) represents the component of voltage V above voltage Vmin. Call it Ve.

One thus has:

$$VOUT = Vbot + k1.k2.G.Ve + k2(Ioffset - I'offset)(1 - G/Gmax).$$

If there was no error voltage in output voltage VOUT, VOUT would only be equal to the sum of the first two terms, that is, Vbot+k1.k2.G.Ve. The expression of VOUT clearly indicates that the structure of the calibration circuit according to the present invention is such that the influence of the error voltages (currents) introduced by the structure is very limited. Indeed, in the expression of the output voltage, the error currents are multiplied by a factor 1−G/Gmax, this factor ranging between 0 and 1, whatever gain G.

This is particularly important in a technology using MOS transistors, since this type of transistor generates significant error voltages. It should be noted that the adjustment of the limiting values of the voltage to be calibrated is particularly simple, even in the case where the circuit is made with MOS transistors.

Further, since the two branches of the circuit are identical, if one of currents I1, I2 varies for any reason, for example after a temperature or supply voltage variation, the other one of currents I1, I2 undergoes the same variation and this variation does not affect current i since currents I1 and I2 are subtracted.

It should be noted that, since the input voltage is converted into current and the amplification is a current amplification, the calibration circuit of the present invention does not clip, even under a low supply voltage. For example, if the maximum value of V is on the order of 3 volts, the calibration circuit of the present invention can be supplied with a supply voltage as low as 3.3 volts. As a comparison, circuit "L6300" mentioned hereabove is supplied with 5 volts. The calibration circuit of the present invention can thus be formed with small transistors, it occupies a reduced surface area and consumes little.

Further, the calibration circuit of the present invention can easily be formed in CMOS technology, and thus easily be formed on a same integrated circuit together with other circuit using MOS transistors. This results in gains in manufacturing time, testing, interconnection, etc. whereby a generally reduced cost for the circuit and a more extensive integration are obtained. An integrated circuit including the calibration circuit according to the present invention and downstream digital circuits may further be supplied with various supply voltages, for example, 3.3 volts for the signal calibration portion, and 1.8 volts for the digital portion.

The various elements of the circuit of FIG. 3 will easily be formed by those skilled in the art. As a non-limiting example, FIGS. 7, 8, and 9 respectively show examples of forming of elements 1, 9, and 5 of FIG. 3.

Figure 7:
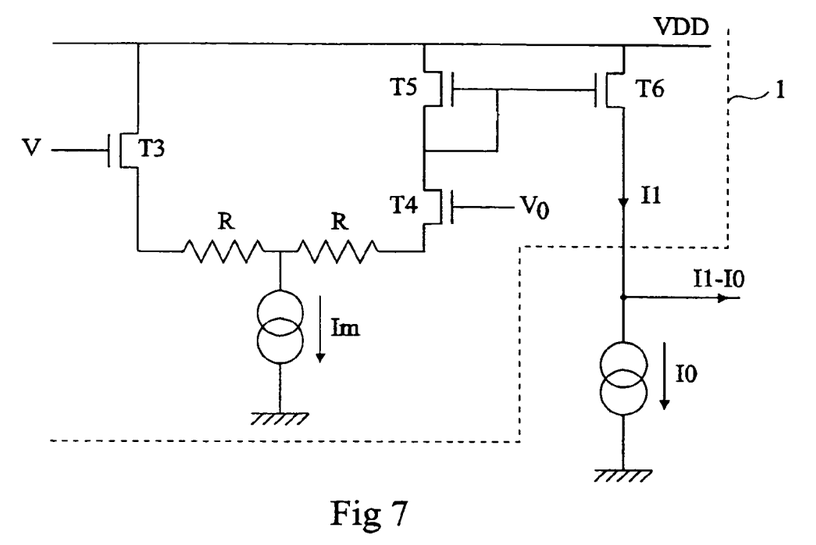
FIGS. 7, 8, and 9 show examples of forming of elements of the circuit of FIG. 3.

In FIG. 7, voltage-to-current converter 1 includes two MOS transistors T3 and T4 forming a differential pair. The respective gates of transistors T3 and T4 are driven by voltages V and $V_0$. The sources of these transistors are connected together via resistors R and their junction point is coupled to ground via a current source run through by current Im. The drain of transistor T3 is connected to a positive supply voltage source VDD and the drain of transistor T4 is connected to a diode-mounted transistor T5. Transistor T5 forms, with a transistor T6, a current mirror. Current I1 at the output of voltage-to-current converter 1 is provided by the source of transistor T6. FIG. 7 further illustrates current source I0 connecting the output of converter 1 to ground. The example of FIG. 7 is an example only and its operation will not be explained any further.

Figure 8:
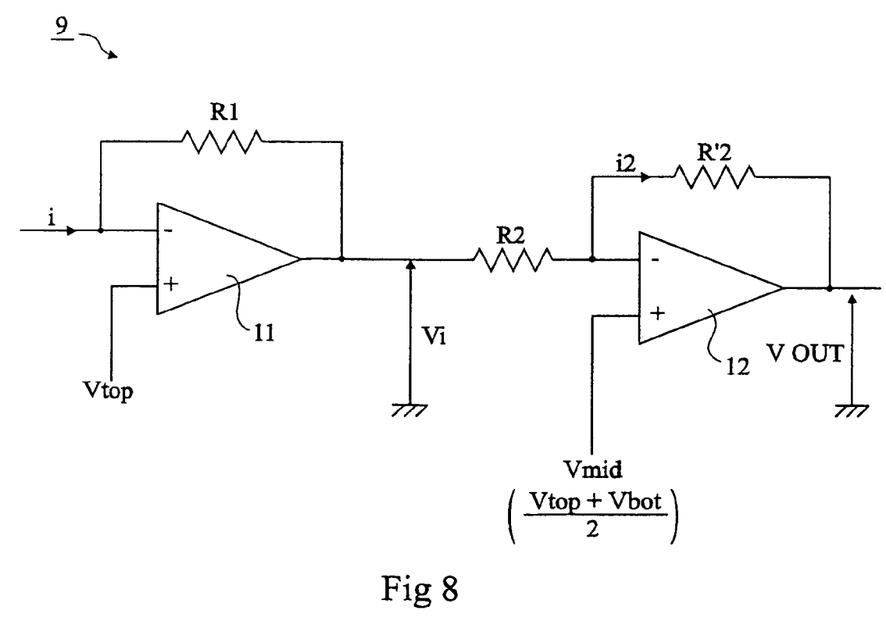

FIG. 8 illustrates a non-limiting example of forming of current-to-voltage converter 9. An operational amplifier 11 receives current i on its inverting input (−) and a voltage equal to Vtop on its non-inverting input (+). The inverting input of amplifier 11 is coupled to the output of amplifier 11 via a resistor R1. Voltage Vi present between the output of amplifier 11 and the ground is equal to Vtop−R1.i. Current-to-voltage converter 9 includes a second stage driven by voltage Vi. This second stage includes an operational amplifier 12 having its inverting input (−) connected to the output of amplifier 11 via a resistor R2. The non-inverting input (+) of amplifier 12 receives a voltage Vmid equal to (Vtop+Vbot)/2. The inverting input of amplifier 12 is coupled to the output of amplifier 12 via a resistor R'2 equal to R2. Output voltage VOUT is equal to Vmid−R2.i2, i2 being the current flowing through resistor R'2. Since Vi is equal to R2.i2+Vmid, VOUT=2Vmid−Vi, that is, VOUT=Vbot+R1.i, which corresponds to the characteristic of FIG. 7, with a coefficient k2 equal to R1.

Figure 9:
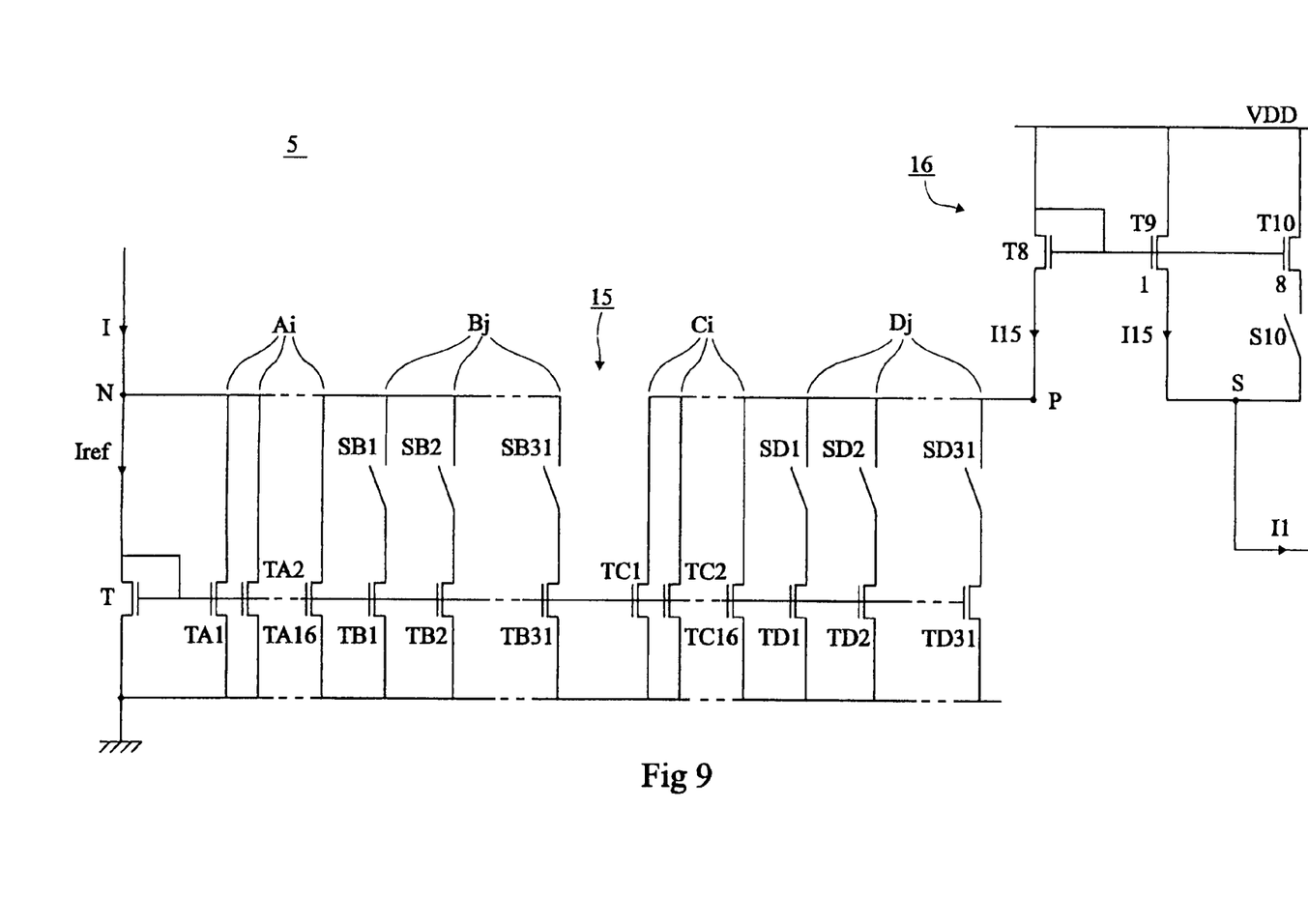

FIG. 9 shows an embodiment of current amplifier 5 enabling easy variation of the amplifier gain in large proportions. In FIG. 9, amplifier 5 is formed of two units 15 and 16.

Unit 15 includes an input node N receiving current I to be amplified (equal to I1−I0). A diode-connected MOS transistor, T, couples node N to ground and is run through by a current Iref. 16 branches Ai, i ranging from 1 to 16, connect node N to ground. Each branch Ai is formed of a MOS transistor TAi. The gate of each transistor TAi is connected to the gate of transistor T. Each transistor TAi forms a current mirror with transistor T and is run through by a current equal to Iref. Node N is also grounded by thirty-one identical branches Bj, j ranging from 1 to 31. Each branch Bj includes a transistor TBj in series with a switch SBj. The gate of each transistor TBj is connected to the gate of transistor T and, when switch SBj is on, the corresponding transistor TBj is run through by a current equal to Iref. Switches SBj are controllable independently from one another and, if a number n of switches SBj is on, current Iref is equal to I/(17+n). When all switches SBj are off, current Iref is equal to I/17; and, when all switches SBj are on, current Iref is equal to I/48.

A node P forms the output of unit 15. Sixteen branches Ci connected in parallel connect node P to ground. Each branch Ci is formed of a MOS transistor TCi. Each transistor TCi has its gate connected to the gate of transistor T and is run through by a current equal to Iref. Node P is also coupled to ground by thirty-one identical branches Dj connected in parallel. Each branch Dj includes a MOS transistor TDj in series with a switch SDj. The gate of each transistor TDj is connected to the gate of transistor T. When a switch SDj is on, the corresponding transistor TDj is run through by a current equal to Iref. Node P is run through by a current I15 equal to Iref×(16+m), m being the number of on switches SDj. Switches SBj and SDj are controlled so that if a switch SBj is off, the corresponding switch SDj is on, and vice versa. Accordingly, the number m of on switches SDj is equal to (31−n), n being the number of on switches SBj.

Gain G1 of unit 15 can vary between 1/3 and 47/17. Indeed, if all switches SBj are on, current Iref is equal to I/48. All switches SDj are then off and current I15 is equal to Iref×16. G1 is then equal to I15/I, that is 16/48 (1/3). If all switches SBj are off, current Iref is equal to I/17. All switches SDj are on and current I15 is equal to Iref×47. G1 is then equal to I15/I, that is, 47/17 (approximately 2.7).

Unit 16 has its input connected to node P. Unit 16 includes three MOS transistors T8, T9, and T10. Transistor T8 is diode-connected. It has its source connected to node P and its drain connected to supply voltage VDD. Transistor T9 has its drain connected to supply voltage VDD and its source connected to a node S forming the output of amplifier 5. The gate of transistor T9 is connected to the gate of transistor T8. Transistors T8 and T9 form together a current mirror. The geometry of transistors T8 and T9 is chosen so that the current running through transistor T9 is equal to current I15 running through transistor T8.

Transistor T10 has its drain connected to supply voltage VDD. The gate of transistor T10 is connected to the gate of transistor T8. The source of transistor T10 is connected to the output via a switch S10. Transistors T8 and T10 form a current mirror. The geometry of transistors T8 and T10 is chosen so that, when on, transistor T10 is run through by a current equal to eight time current I15 running through transistor T8. Thus, when switch S10 is on, current I1 provided at the output of amplifier 15 is equal to 9 times current I15.

By playing on the turning-off or on of switches SBj, SDj, and S10, the gain of amplifier 5 can vary from 1/3 to 47×9/17, that is, approximately 24.8.

Current amplifier 5 of FIG. 9 is particularly advantageous. On the one hand, it is made in the form of two units, which enables easily obtaining a more significant gain. Further, switches SBj, SDj, and S10 can be easily made in the form of MOS transistors controlled to be turned off or to be turned on by logic signals 0 or 1. Unit 15 is then controlled by a digital number N coded over five bits, providing values from 0 to 31. Switches SBj will for example be controlled by number N and switches SDj by the inverse of number N. The control signal applied on input G of amplifier 5 then is a number coded over six bits, the five least significant bits (N) controlling unit 15 and the most significant bit controlling switch S10 of unit 16. Since the gain of the second unit has been chosen to be equal to 1 or to 9, the gain of amplifier 5 varies monotonously when the binary control number varies from 011111 to 100000. Such a structure, which is said to be linear in decibels, is particular advantageous since the gain is easily adjusted by a digital procedure.

Of course, the present invention is likely to have various alterations, modifications, and improvements which will readily occur to those skilled in the art. In particular, it should be noted that branches 1, 2, 5 and 1', 2', 5' are not necessarily identical, in a circuit where specifications in terms of error voltage are not critical.

Further, although current amplifiers 5 and 5' have been described as having an adjustable gain, they may have a fixed gain, if the A.C. component of voltage V to be calibrated does not vary excessively.

Moreover, it should be noted that voltage $V_0$ is not necessarily chosen to be substantially equal to the minimum level of the voltage to be calibrated.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A circuit for calibrating a voltage signal, including:
a first voltage-to-current converter receiving a voltage signal to be calibrated and a reference voltage, and providing a current proportional to the voltage difference between the voltage of the signal to be calibrated and the reference voltage,
a first current amplifier driven by the first voltage-to-current converter,
a second voltage-to-current converter receiving an adjustment voltage and the reference voltage and providing a current proportional to the voltage difference between the adjustment voltage and the reference voltage,
a second current amplifier driven by the second voltage-to-current converter, and
means for providing a calibrated voltage signal based on the difference between the currents provided by the first and second current amplifiers.

2. The circuit of claim 1, wherein said means for providing a calibrated voltage signal includes:
a current conversion means driven by the second current amplifier for providing a current of same amplitude and of sign opposite to that of the current that it receives, and
a current-to-voltage converter driven by the first current amplifier and by the current conversion means and providing the calibrated voltage signal.

3. The circuit of claim 1, wherein the first and second current amplifiers, as well as the first and second voltage-to-current converters, have an identical structure.

4. The circuit of claim 3, wherein the first and second current amplifiers have a variable gain and their gain is identically controlled.

5. The circuit of claim 1, wherein each of the first and second current amplifiers includes several amplifier units.

6. The circuit of claim 5, wherein each of the first and second current amplifiers includes a first unit and a second unit, the second unit ensuring a current gain equal to 1 or to 9.

7. The circuit of claim 6, wherein the first unit includes:
an input node coupled to ground via a diode-connected transistor, 16 identical branches, each formed of a transistor, and 31 identical branches, each including a transistor in series with a switch, each of the transistors coupled to the input node being flown, when on, by a same current, and
an output node coupled to ground via 16 identical branches, each formed of a transistor, and 31 identical branches, each including a transistor in series with a switch, each of the transistors coupled with the output node being flown, when on, by a current of same value as any each transistor coupled with the input node, in the on state.

8. The circuit of claim 1, wherein the adjustment voltage is adjustable and is used to set the minimum value of the calibrated signal.

9. The circuit of claim 1, including a first current source arranged between the output of the first voltage-to-current converter and a fixed voltage, and a second current source arranged between the output of the second voltage-to-current converter and said fixed voltage.

10. The circuit of claim 1, wherein the adjustment voltage is adjustable and is used to set the minimum value of the calibrated signal.

11. A circuit for calibrating a voltage signal, including:
a first voltage-to-current converter receiving a voltage signal to be calibrated and a reference voltage, and providing a current proportional to the voltage difference between the voltage of the signal to be calibrated and the reference voltage,
a first current amplifier driven by the first voltage-to-current converter,
a second voltage-to-current converter receiving an adjustment voltage and the reference voltage and providing a current proportional to the voltage difference between the adjustment voltage and the reference voltage,
a second current amplifier driven by the second voltage-to-current converter, and
means for providing a calibrated voltage signal based on the difference between the currents provided by the first and second current amplifiers,
each of the first and second current amplifiers includes a first unit and a second unit, the second unit configured to ensure a current gain equal to a range of 1–9, the first unit including:
an input node coupled to ground via a diode-connected transistor, 16 identical branches, each formed of a transistor, and 31 identical branches, each including a transistor in series with a switch, each of the transistors coupled to the input node being flown, when on, by the same current, and
an output node coupled to ground via 16 identical branches, each formed of a transistor, and 31 identical branches, each including a transistor in series with a switch, each of the transistors coupled with the output node being flown, when on, by a current of same value as any each transistor coupled with the input node, in the on state.

12. The circuit of claim 11, further comprising a first current source arranged between the output of the first voltage-to-current converter and a fixed voltage, and a second current source arranged between the output of the second voltage-to-current converter and the fixed voltage.

13. The circuit of claim 11, comprising a current conversion circuit driven by the second current amplifier to provide a current of same amplitude and of a sign opposite to that of the current it receives.

14. A calibration circuit, comprising:
first and second current amplifiers receiving as input first and second proportional currents from first and second voltage-to-current converters, respectively; a current converter driven by the second current amplifier and configured to provide a current of the same amplitude and of a sign that is opposite to that of the current that it receives; and a current-to-voltage converter driven by the first current amplifier and by the current conversion circuit and configured to provide on an output thereof a calibrated voltage signal based on the difference between the currents provided by the first and second current amplifiers.

15. The circuit of claim 14, comprising a current conversion circuit driven by the second current amplifier to provide a current of same amplitude and of a sign opposite to that of the current it receives.

16. The circuit of claim 14, wherein the first and second current amplifiers, as well as the first and second voltage-to-current converters, have an identical structure.

17. A circuit for calibrating a voltage signal, including:
a first voltage-to-current converter receiving a voltage signal to be calibrated and a reference voltage, and providing a current proportional to the voltage difference between the voltage of the signal to be calibrated and the reference voltage,
a first current amplifier driven by the first voltage-to-current converter,
a second voltage-to-current converter receiving an adjustment voltage and the reference voltage and providing a current proportional to the voltage difference between the adjustment voltage and the reference voltage,
a second current amplifier driven by the second voltage-to-current converter, and
means for providing a calibrated voltage signal based on the difference between the currents provided by the first and second current amplifiers;
the first and second amplifiers comprise a first amplifier unit and a second amplifier unit, the second amplifier unit ensuring a current gain equal to 1 or to 9, and the first unit comprising:
an input node coupled to ground via a diode-connected transistor, 16 identical branches, each formed of a transistor, and 31 identical branches, each including a transistor in series with a switch, each of the transistors coupled to the input node being flown, when on, by a same current, and
an output node coupled to ground via 16 identical branches, each formed of a transistor, and 31 identical branches, each including a transistor in series with a switch, each of the transistors coupled with the output node being flown, when on, by a current of same value as any each transistor coupled with the input node, in the on state.

18. The circuit of claim 17, comprising a first current source arranged between the output of the first voltage-to-current converter and a fixed voltage, and a second current source arranged between the output of the second voltage-to-current converter and said fixed voltage.

* * * * *